(12) United States Patent
Tillotson

(10) Patent No.: US 8,735,712 B2
(45) Date of Patent: May 27, 2014

(54) PHOTOVOLTAIC RECEIVER FOR BEAMED POWER

(75) Inventor: Brian J. Tillotson, Kent, WA (US)

(73) Assignee: The Boeing Company, Chicago, IL (US)

( * ) Notice: Subject to any disclaimer, the term of this patent is extended or adjusted under 35 U.S.C. 154(b) by 1712 days.

(21) Appl. No.: 11/459,219

(22) Filed: Jul. 21, 2006

(65) Prior Publication Data

US 2008/0017239 A1    Jan. 24, 2008

(51) Int. Cl.
*H02N 6/00* (2006.01)
(52) U.S. Cl.
USPC ........... 136/246; 136/244; 136/245; 136/243; 136/239; 136/250; 136/251
(58) Field of Classification Search
USPC .......................................... 136/243, 245, 246
See application file for complete search history.

(56) References Cited

U.S. PATENT DOCUMENTS

| 5,498,297 | A | 3/1996 | O'Neill et al. | |
|---|---|---|---|---|
| 5,503,350 | A * | 4/1996 | Foote | 244/1 R |
| 6,248,949 | B1 | 6/2001 | Turner | |
| 6,248,950 | B1 * | 6/2001 | Hoeber et al. | 136/251 |
| 6,364,253 | B1 * | 4/2002 | Cavanagh | 244/190 |
| 6,485,152 | B2 | 11/2002 | Wood | |
| 6,531,653 | B1 | 3/2003 | Glenn et al. | |
| 6,534,705 | B2 * | 3/2003 | Berrios et al. | 136/243 |
| 6,660,927 | B2 * | 12/2003 | Zwanenburg | 136/244 |
| 6,818,818 | B2 | 11/2004 | Bareis | |
| 6,971,756 | B2 | 12/2005 | Vasylyev et al. | |
| 2002/0134423 | A1 * | 9/2002 | Eller et al. | 136/245 |
| 2005/0022858 | A1 * | 2/2005 | Terao et al. | 136/246 |
| 2006/0225778 | A1 * | 10/2006 | Brabec et al. | 136/244 |

OTHER PUBLICATIONS

Landis, Geoffrey A., Photovoltaic Recievers for Laser Beamed Power in Space, Journal of Propulsion and Power, vol. 9, No. 1, Jan.-Feb. 1993.*
Blackwell, "Recent demonstrations of Laser power beaming at DFRC and MSFC", Beamed Energy Propulsion, 2005.*
Qian et al., "Photothermal radiometry measurement of thermal diffusivity", Applied Optics, 1990.*
Geoffrey A. Landis, Moonbase Night Power by Laser Illumination, Published in AIAA Journal of Propulsion and Power, vol. 8, No. 1, Jan. 1992, http://powerweb.grc.nasa.gov/pvsee/publications/lasers/laser_moon.html.
Geoffrey A. Landis, Satellite Eclipse Power by Laser Illumination, IAF-90-053, Published in Acta Astronautica, vol. 25 No. 4, pp. 229-233, 1991, http://powerweb.grc.nasa.gov/pvsee/publications/lasers/IAF90_053.html.

(Continued)

*Primary Examiner* — Jennifer Michener
*Assistant Examiner* — Matthew Martin
(74) *Attorney, Agent, or Firm* — Smith Moore Leatherwood LLP

(57) ABSTRACT

A system and method directed to using a PV array and laser beamed-power for aircraft and satellites is provided. More specifically, a system and method directed to a PV receiver that reduces power losses caused by variations in irradiance is provided. The use of a sloped array with a grooved cover glass coated with reflective coating allows the system and method to receive the laser beamed power at an angle and reduce any losses while producing a maximum power output. In addition, the use of capacitors in parallel with the PV cells in the array reduces resistive losses caused by short-term optical fluctuations and assists in maximizing power output for the array.

22 Claims, 10 Drawing Sheets

(56) References Cited

OTHER PUBLICATIONS

Geoffrey A. Landis and Larry H. Westerlund, Laser Beamed Power: Satellite Demonstration Applications, IAF-92-0600, NASA CR-190793, http://powerweb.grc.nasa.gov/pvsee/publications/lasers/IAF92_0600.html.

Mark J. O'Neill, Michael F. Piszczor, Michael I. Eskenazi, A.J. McDanal, Patrick J. George, Matthew M. Botke, Henry W. Brandhorst, David L Edwards, Paul A. Jaster, The Stretched Lens Array (SLA): A Low Risk, Cost-Effective Concentrator Array Offering Wing-Level Performance of 180 W/KG and 300 W/M, IECEC 2002 Paper No. 20115, html version of the file http://www.aec-able.com/corpinfo/Resources/IECEC%202002%20Paper%20No.%2020115.pdf.

Geoffrey A. Landis, Mark Stavnes, Steve Oleson, John Bozek, AIAA-92-3213: Laser Power Beaming, Space Transfer with Ground-Based Laser/Electric Propulsion, http://powerweb.grc.nasa.gov/pvsee/publications/lasers/AIAA92_3213.html.

\* cited by examiner

PHOTOVOLTAIC RECEIVER FOR BEAMED POWER

FIELD OF THE INVENTION

The present invention is directed to photovoltaic (PV) receivers for beamed power system. More specifically, the present invention is directed to an improved PV receiver that reduces inefficiency caused by overheating of PV cells and reduces resistive losses caused by fluctuations in irradiance.

BACKGROUND OF THE INVENTION

Currently, aircraft are limited in flight range and flight duration because of fuel capacity and fuel consumption. These limits require aircraft to return for refueling and also prevent them from unlimited flight ranges. Further, aircraft are also limited by weight constraints, such as the weight of the fuel necessary for travel that limits the speed and cargo capacity of the aircraft. Some airplanes use solar power to eliminate these issues, however solar power systems experience power reductions due to weather and atmospheric changes, the Earth's annual and diurnal cycles, or solar eclipses. Therefore, aircraft that use solar power require supplemental or alternate sources of energy. Laser or microwave power beaming from the Earth's surface, from other aircraft, or from satellites orbiting the Earth can be used to supplement the solar power to aircraft.

Current systems that provide laser-beamed power to aircraft by using photovoltaic (PV) arrays and receivers have problems with obtaining uniformity of power transfer across the PV array. A PV array designed for solar powered applications includes PV cells arranged on a flat planar surface. In solar powered spacecrafts or terrestrial solar power applications, the planar PV array experiences generally uniform, steady irradiance across all the cells in the array. However, the planar PV array does not experience a uniform irradiance across all the cells in the array when illuminated with laser-beamed power. The intensity of the laser varies across the width of the beam, with higher intensity at the center of the beam and generally weaker intensity away from the center. The irradiance received by a planar laser-power PV receiver is therefore non-uniform, with the strongest rays at the center of the PV array and weaker rays impinging upon the PV cells toward the edges of the PV array.

Currently, planar PV arrays or receivers that are designed for use with solar power have rows of identical photovoltaic cells arranged on a flat surface. With uniform illumination, all of the PV cells in the PV array receive the same irradiance of light and produce approximately the same output power. The PV cells are connected in series in a string, and the strings are then connected in parallel with other strings to form the PV array. The PV cells are connected in series to produce a sufficient voltage. Within a string, all of the PV cells conduct the same amount of current. Multiple strings are connected in parallel to produce adequate current at the selected voltage. When the PV array is illuminated with uniform solar rays, each string of PV cells produces the same current. Further, since every PV cell in the array has roughly the same internal resistance, the resistive loss in each cell is approximately the same.

Unlike sunlight, a long-range laser beam illuminating a planar PV array has a roughly Gaussian time-averaged intensity profile. The Gaussian average intensity profile results in varied irradiance across the PV cells. The PV cells at the center of the PV array have much higher irradiance than the PV cells at the edge of the array. If a PV array is designed for optimum efficiency at the lower irradiance levels at the edges, the PV array will likely experience overheating at the center of the array, because the PV cells in the center are not rated for the higher irradiance beams incident on the center. The overheating of the PV cells at the center increases their electrical resistance and therefore increases resistive losses for the array. Conversely, a PV array designed for optimum efficiency at the high irradiance in the center of the PV array results in reduced average power production per PV cell, i.e. the PV cells at the edge do not receive the total irradiance for which they are rated, resulting in reduced power output. In either case, costly resources, i.e. PV cells, are used below their optimum capacity. Therefore, a system and method is needed for achieving uniform irradiance on all PV cells in a laser-powered PV array.

Another deficiency in current planar PV arrays systems is that atmospheric inhomogeneities create rapid variations in refractivity across the width of the laser beam. These variations in refractivity cause variations in irradiance across the surface of the PV array. Short-term variations in irradiance caused by inhomogeneities of the atmosphere affect the current produced by each cell in the array. Greater current from one cell increases the $I^2 R$ losses of all cells in the string and results in greater overall average losses for the entire array. Therefore, a system and method of adjusting for the variations in irradiance across the array cells is needed.

Thus, in view of the disadvantages of the current methods and systems, and in view of the current demand in the relevant art, what is needed is a method and system to provide PV laser-beamed power to satellites and aircraft while mitigating the effects of the current unsteady, non-uniform illumination in these systems.

SUMMARY OF THE INVENTION

A photovoltaic (PV) array includes a plurality of photovoltaic (PV) cells, each PV cell of the plurality of PV cells being configured to receive at least one optical power beam and convert power from the at least one optical power beam to electrical power. Wherein the PV array has a surface geometry arrangement to equalize irradiance of the PV cells received from the at least one optical power beam across the PV array.

A method of converting laser beam power to electrical energy with a photovoltaic (PV) array, the PV array comprised of a plurality of PV cells, includes the steps of providing the PV array on an airborne vehicle, wherein the PV array has a surface geometry arranged to equalize irradiance of the plurality of PV cells received from the laser power beam across the PV array. The method also includes the step of directing the laser beam toward the PV array, receiving the laser beam on the PV array and converting the laser beam into electrical power. The method also includes powering the airborne vehicle with the converted electrical power.

An advantage of the present invention is that the use of laser/optical beams to illuminate PV arrays provides higher average power levels to be delivered to the PV array.

Another advantage of the present invention is that when illuminated by laser/optical beams, the PV arrays are not subject to the diurnal, seasonal, and geographic variations that characterize solar powered arrays.

Another advantage of the present invention is reduced resistive losses caused by local fluctuations in irradiance on the receiver.

Yet another advantage of the present invention is more uniform irradiance of the laser beam across the surface of the array.

A further advantage of the present invention is increased power transfer from partial reflectivity of the coverglass.

Yet another advantage of the present invention is the availability of unlimited flight duration for surveillance, weather monitoring and communications relays.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to refer to the same or like parts.

DETAILED DESCRIPTION OF THE INVENTION

The present invention is directed to a method and system for using photovoltaic (PV) arrays to provide optical beamed power to satellites, aircraft, and other similar apparatus. The optical beamed power can include, but is not limited to laser beams, infrared beams, and ultraviolet rays. When used herein, the term "laser" is understood to include any form of optical beam, and the terms are used interchangeably herein. The present invention employs laser-power beams incident on a PV array to provide steady, uniform illumination, while reducing or eliminating the diurnal, seasonal, and geographic variations that are inherent with solar power.

Figure 1:
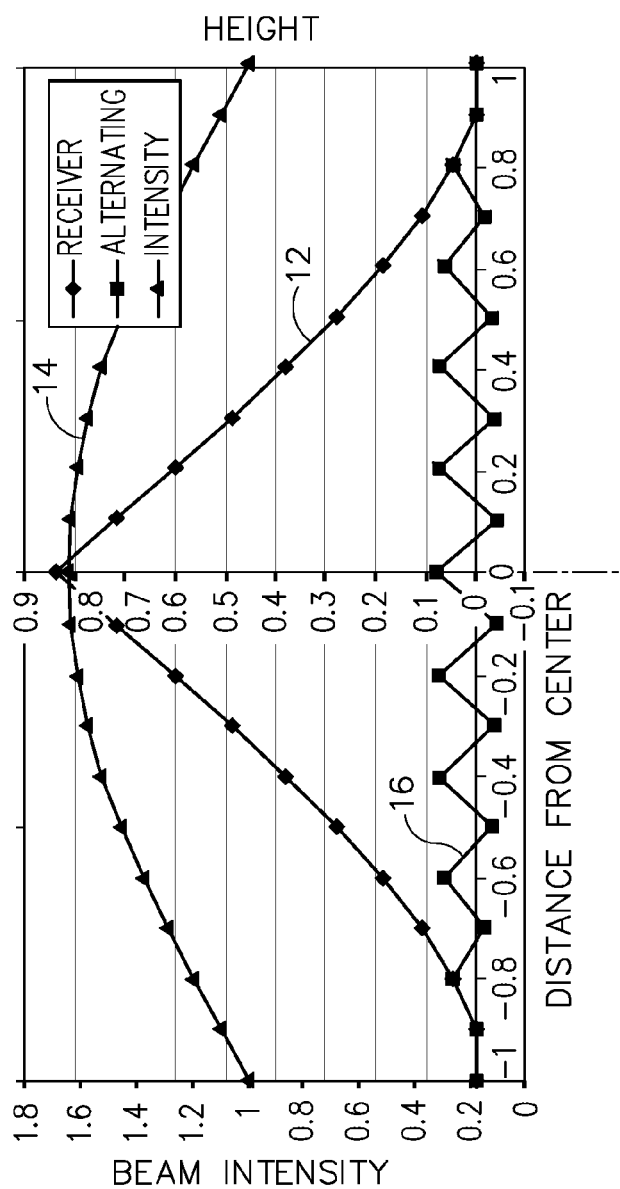
FIG. 1 illustrates a graph showing the beam intensity versus the distance from the center of the PV array for various configurations of a PV array of the present invention.

Referring first to FIG. 1, a graph shows alternate configurations for a PV array 12, 16 and a curve 14 showing the beam intensity that is approximately identical for both PV array configurations 12, 16. First there is shown a curved, approximately conical profile 12 of a PV array with a cusp and slopes, and a curve 14 of the beam intensity as a function of the distance from a central axis of the conical PV array 12. The conical profile 12 represents one embodiment of a PV array or receiver. A layer of PV cells covering substantially the entire inner or outer surface of the cone 12 from the PV array, and laser light is directed at the PV cells to generate electrical power. The PV array has a curved profile 12 that compensates for varied irradiance of an arriving laser beam with varied intensity. A typical arriving laser beam has an instantaneous intensity profile given by a Bessel function, but jitter in the beam-steering mechanism smears the instantaneous intensity profile into a time-averaged intensity profile given by a Gaussian distribution. Therefore, a typical arriving laser beam has a time-averaged intensity profile I(r) represented by Equation 1:

$$I(r)=I_0\exp(-r^2/\sigma^2) \qquad \text{Equation 1}$$

Where:
 $I_0$=intensity at the beam's center
 r=distance from the beam's center
 σ=1/e fall-off distance In an ideal contour 12 for a conical array receiving a Gaussian beam 14, some elements of the PV array are angled so the irradiance at each point is reduced by a reduction factor. The reduction factor is a function of a cosine of the angle of incidence of the beam. The angle of the array at each point is defined by Equation 2:

$$\theta=ar\cos(I_0\exp(-r_{max}^2/\sigma^2)/I(r)) \qquad \text{Equation 2}$$

Where:
 θ=array angle from beam-normal
 $r_{max}$=distance from the PV array's center to its furthest edge.

The curve 12 satisfies the condition set forth in Equation 3:

$$I_0\exp(-r_{max}^2/\sigma^2)=I(r)|\cos\theta| \qquad \text{Equation 3}$$

such that the beam intensity times the cosine factor, [I(r)|cos θ|] is a constant value, represented as K, defined in Equation 4:

$$K=I_0\exp(-r_{max}^2/\sigma^2) \qquad \text{Equation 4}$$

The constant K represents the beam intensity at the furthest edge of the PV array. Because cos θ=1 and θ=0 at the furthest edge of the PV array, the cells at the edge of the array 12 are positioned to receive the beam directly as shown graphically in FIG. 1 on the outer edges 2 of the graph. Closer to the center of the array 12, the cells are arranged at an angle to distribute the beam's more direct intensity over a larger cell area in order to reduce losses or overheating. With the cells positioned at an angle, each cell in the center of the array receives the same irradiance, or radiant power per unit area, as the PV cells at the edge of the array. Therefore, identical PV cells can be used for the entire PV array where each receives the same irradiance, produces the same current, and operates at roughly the same temperature.

A conical array 12 is capable of facing directly toward the source of the beam and receives the beam with little angle. The conical array/receiver 12 is preferably used on satellites that are able to point directly toward the beam with a selected direction and concurrently maintain a stable attitude. The graph of FIG. 1 presumes that the width of the beam (e.g. twice the distance σ) is approximately constant over time. Constant beam width may be achieved by designing the PV array for the widest beam width that will be encountered in operation. The widest beam width is determined based on the maximum range from the laser source to the array. When the receiver is less than the maximum distance from the laser source, the laser beam may be adjusted at the source to obtain a constant beam width at the PV array.

An alternate configuration for a sawtooth array profile 16 compensates for a beam intensity curve 14 approximately identical to that of conical array 12. Typically, one side of the sawtooth array is covered by PV cells to form the PV array, although in some applications for the sawtooth array, both sides may be covered by PV cells, as discussed in greater detail below. The slopes of the array can be angled either towards or away from the beam source, alternating between a positive slope and a negative slope, forming a peak, or cusp in between, to achieve the sawtooth profile 16.

Figure 2:
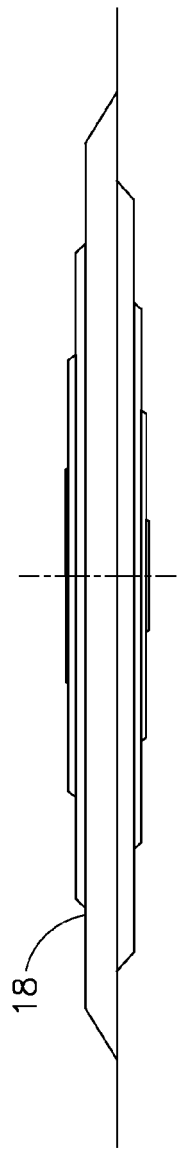
FIG. 2 is an elevational view of one embodiment of a PV array receiver.
Figure 3:
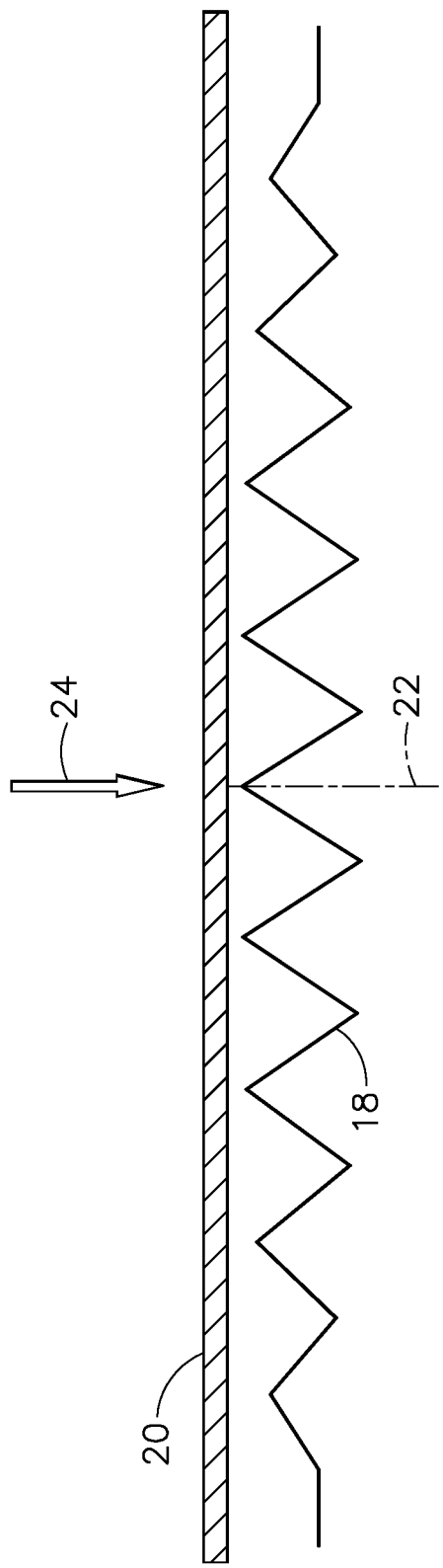
FIG. 3 illustrates a sectional view of a sawtooth-configured PV array.

Referring next to FIGS. 2 and 3, a PV array 18 has a sawtooth cross-sectional configuration with a circular periphery, elliptical periphery, or any other similar shape that will efficiently capture most of the optical beam's power without excessive array surface area. Compared to the conical configuration 12, the sawtooth configuration has a slimmer cross-sectional area, which is advantageous for use on an aircraft. The slimmer cross-section of PV array 18 reduces the aerodynamic drag on the aircraft. However, the reduction in drag may be partially offset by turbulence caused by the sawtooth cross-sectional array 18, increasing wind drag. The turbulence is caused by the disruption of the airflow as it passes over the sawtooth grooves in the PV array 18. This turbulence may be substantially eliminated by placing a smooth transparent shield 20, e.g. glass or other suitable transparent material, over the top and bottom (not shown) of the PV array 18. The slimmer profile also reduces overall thickness of the PV array 18, as contrasted with the conical PV array 12, making the sawtooth PV array 18 more compatible with the aerodynamic constraints of aircraft or satellite launch shrouds. The slimmer profile of the PV array 18 also provides the equivalent beam receiving angles as a conical array having profile 12.

The number of individual saw tooth sections in PV array 18 might vary to suit the application. The cost of the complex geometry typically increases as more sawtooth sections are added, because more material is required to reinforce the angular bends or teeth. More material may increase the weight of the PV array, or at least increase the cost if lightweight materials having comparably high strength are used. Thus, a slimmer sawtooth PV array 18 typically includes a greater number of teeth, adding weight to the array 18, whereas a PV array 18 including fewer teeth may weigh less, but has a thicker, less aerodynamic profile.

Figure 2A:
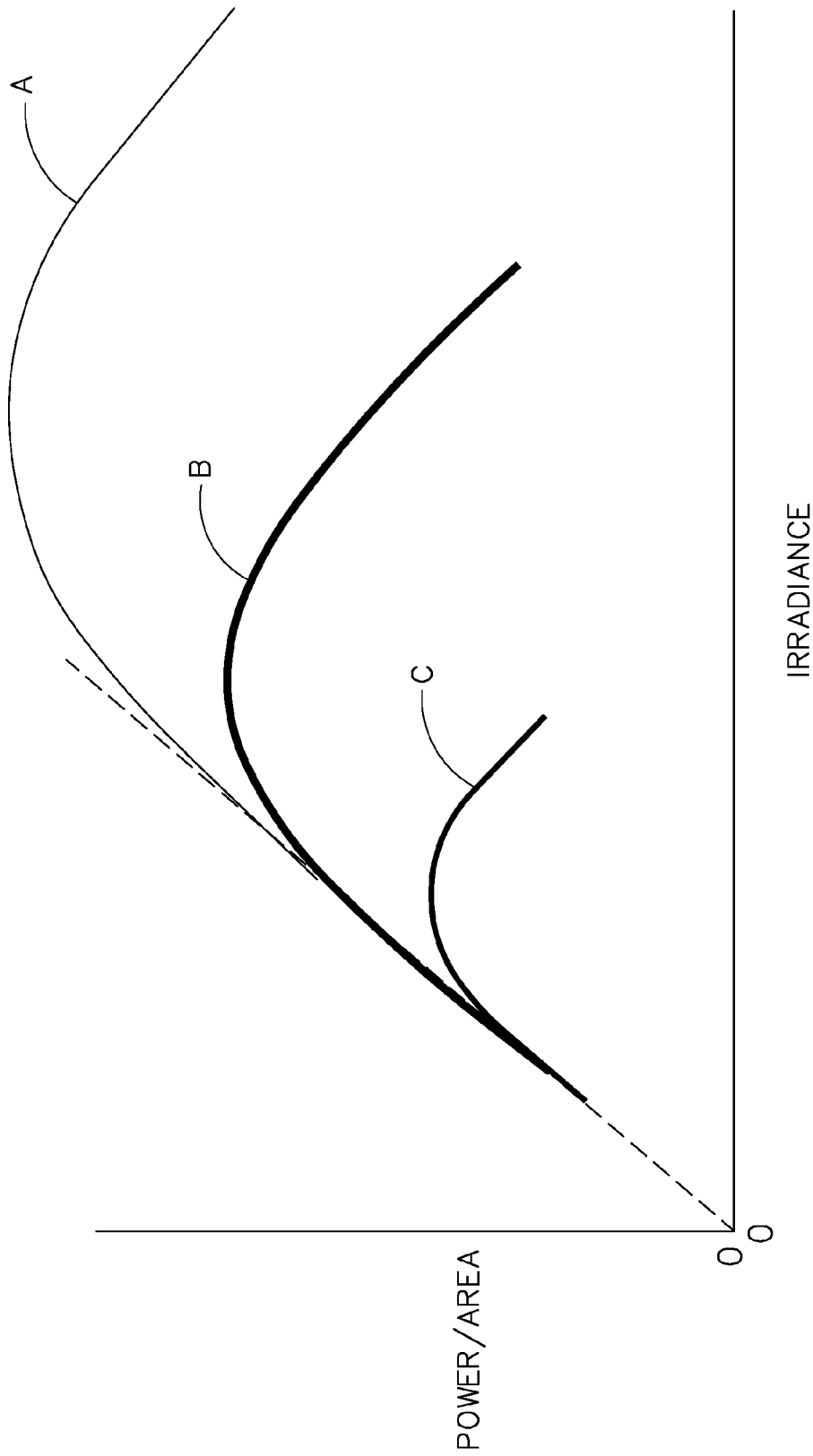
FIG. 2a is a graphical illustration of the areal efficiency (i.e. power per unit area) of PV cells of the PV array receiver.

FIG. 2A further explains the purpose of the sloped configurations 12 and 16 of the PV array. Any optical laser beam inherently has stronger intensity in the center, with the intensity becoming less near the edges of the beam. The corresponding stronger irradiance in the center allows for more power production, but also causes high temperatures that damage the cells or reduce their efficiency. The cells that are illuminated by the edges of the laser beam experience cooler temperatures, however the irradiance is less and less power is produced.

Curve A shows the relationship of irradiance and output power for a PV array that uses both high-temperature materials and a high-capacity cooling system. Slight increases in irradiance cause increases in power output, with a substantially linear relationship. However, as irradiance increases further, the temperature of the PV cell increases and internal losses increase. Although the cell produces more power at the higher irradiance, the efficiency is reduced. At some value of irradiance, power output of the cell is maximized. At higher irradiance, the cell becomes so hot that its internal losses exceed the increased PV power available from the laser light. Relative to curves B and C, the PV array of curve A will be quite costly. Nonetheless, it, too, has a peak power level. Beyond that, increased irradiance produces less power. Thus, further increases in irradiance produce less power, due to the increase of temperature and internal losses.

Curve B illustrates the relationship between irradiance and electrical power for a PV cell that has a somewhat better cooling system than the cell of curve C, or is constructed from materials that are less affected by higher temperatures. For curve B, the relationship remains linear to a higher value of irradiance, and the maximum power output of the cell is greater than for curve C. Nonetheless, above a certain irradiance, power output of the cell decreases. Curve C shows the effect of irradiance on power output of a typical PV cell. At low irradiance, the cooling system of the PV array easily keeps the cell cool, and the cell remains efficient at converting laser light to electricity.

The use of the sloped configurations 12 and 16 as described in FIG. 1 allows the laser beam to hit some cells at an angle rather than directly, which reduces the irradiance on those cells. By specifying the slope of each PV cell in accordance with equation 2 and choosing the beam center intensity $I_0$ such that the irradiance from the laser beam matches each cell's optimal irradiance, the invention enables each cell to produce an optimal amount of power, regardless of its distance from the center of the beam. This provides the most cost-effective use of expensive PV cells.

As discussed above, the saw tooth shape of the PV array 18 is likely to increase the aerodynamic drag on an aircraft. The additional drag is due to the non-aerodynamic shape of the sawtooth array 18. Referring to FIG. 3, a transparent surface 20 may be positioned over one or both sides of the PV array 18 to allow the air to flow across the smoother aerodynamic surface of the transparent surface 20. The PV array 18 is perpendicular to its axis 22. Arrow 24 indicates an incident laser beam 24 illuminating PV cells on the top surface of the PV array 18. The circular sawtooth PV array 18 is suitable for applications where the beam 24 impinges perpendicularly with the PV array 18, i.e., at a zero angle of incidence. However, for an aircraft application, perpendicular impingement of the laser beam is not always possible due to the mobility of the aircraft.

Figure 4:
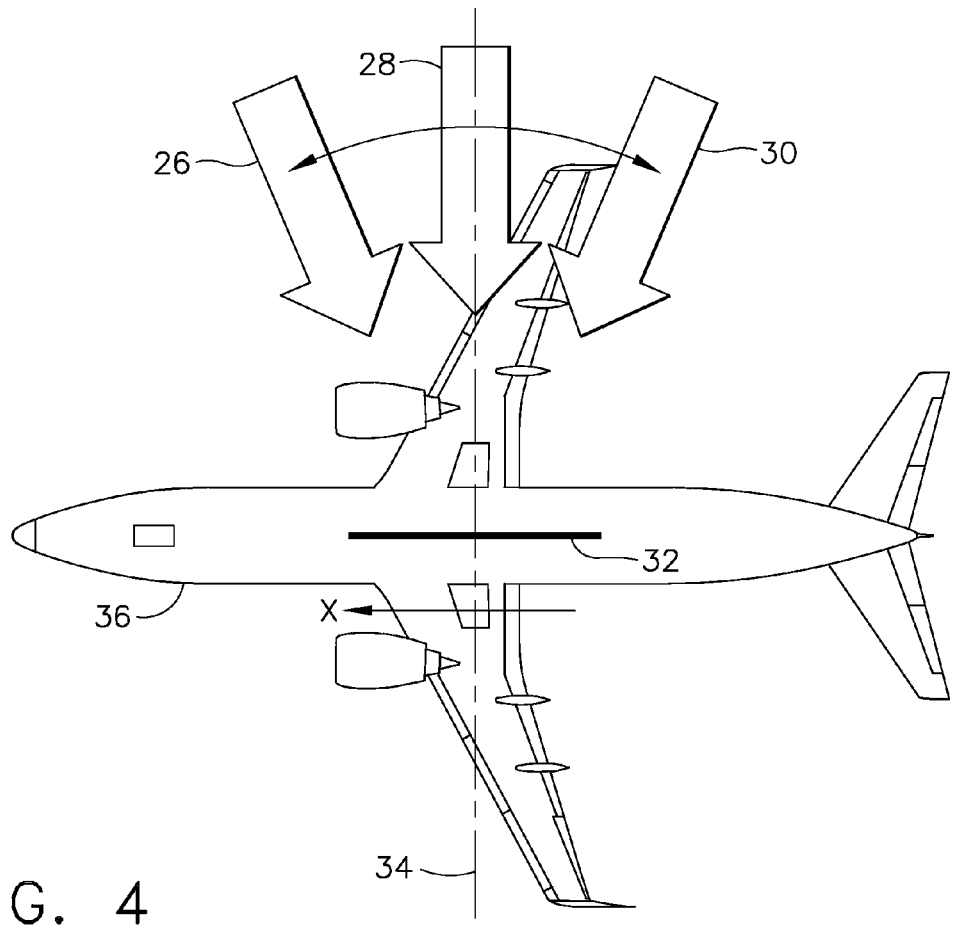
FIG. 4 illustrates the bottom view of an airplane with a PV receiver mounted thereon, with various arrival angles of a power beam shown.
Figure 5:
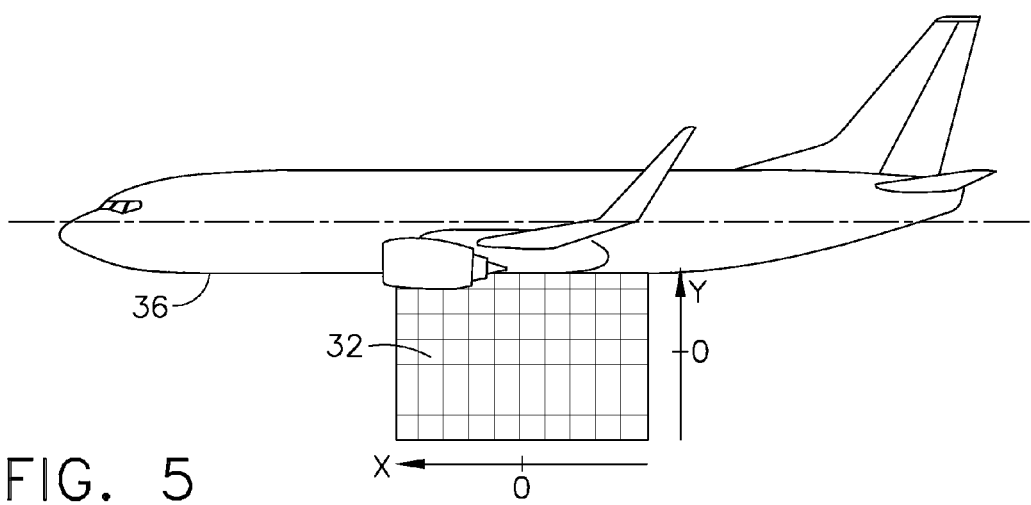
FIG. 5 is an elevational view of the airplane shown in FIG. 4.

Referring to FIGS. 4 and 5, for aircraft applications, arrows 26, 28, 30 represent variety of angles from which a beam may arrive, directed at a rectangular sawtooth array 32. There is typically only one laser beam directed at an aircraft 36, but as indicated by arrows 26, 28 and 30, the beam may originate from a location forward of the lateral axis 34 of aircraft 36, a location coaxial with the lateral axis 34, or from the rear of the lateral axis 34. Typically, the rectangular PV array 32 can be swiveled in elevation to create a more direct path to the PV array 32. The PV array 32 cannot be swiveled in azimuth, however, as that would perturb the flight of the aircraft 36. Therefore, an alternate embodiment of the invention is needed where a rectangular PV array 32 can effectively receive a laser beam 26, 28 or 30, from various angles without significant degradation in power transfer.

Assuming the rectangular PV array 32 can be manipulated anywhere from a few degrees to substantially 180 degrees about the longitudinal x axis 23 to match the elevation angle of the beam, the irradiance, $I_r$, at any point (x,y) on the PV array 32 varies with the beam's incident angle as shown in Equation 5:

$$I_r(x,y,\alpha) = I_0 \cos \alpha \exp[(-y^2 - x^2 \cos^2 \alpha)/\sigma^2)] \qquad \text{Equation 5}$$

Where:
x=longitudinal distance from the beam's center
y=vertical distance from the beam's center
σ=Gaussian beam width, 1/e, at the receiver α=incident angle of the beam forward or aft of the lateral axis 34

The coordinate system origin for x and y is assumed to also be the center of the PV array, i.e. the beam is aimed at the center of the PV array. To separate the dependence on the vertical distance from the beam's center, y, from the horizontal distance, x, Equation 6 is used:

$$I_r(x,y,\alpha) = I_0 \cos\alpha \exp(-x^2 \cos^2\alpha)/\sigma^2) \exp(-y^2/\sigma^2) \quad \text{Equation 6}$$

Figure 6:
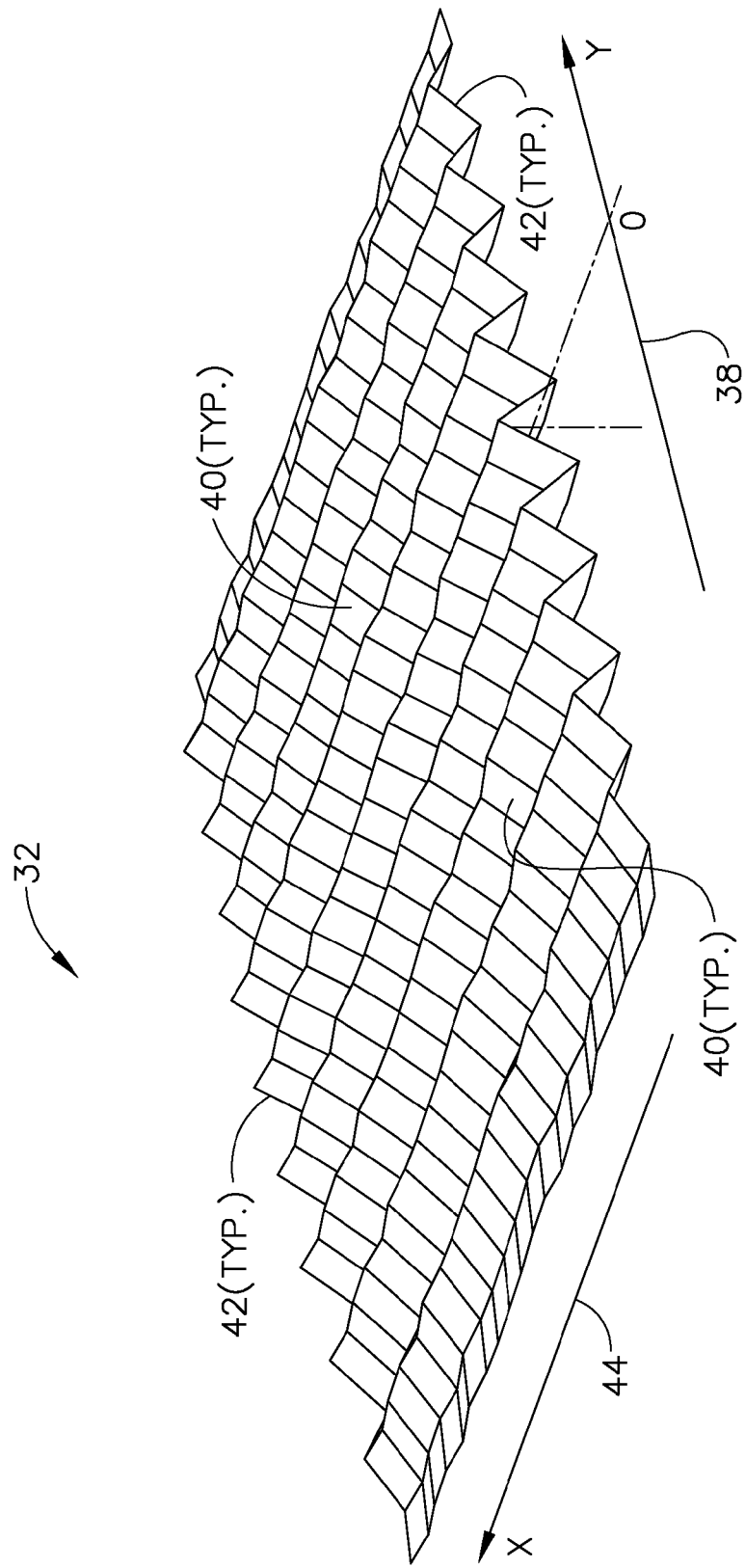
FIG. 6 is a perspective view of one embodiment of the PV array.

Referring to FIG. 6, a rectangular array 32 has planar symmetry about a y-axis 38. In each string or row 42, a plurality of PV cells 40 are angled as defined by Equation 2 above, with the distance along the y-axis 38 substituted for the radius r. When the PV array 32 is properly swiveled to face the beam, a laser beam (not shown) arrives perpendicular to the vertical or y-axis 38, but obliquely with respect to the longitudinal or x-axis 44. Since the irradiance is substantially identical for every PV cell 40 in a vertical row 42 of the PV array 32 at a particular distance along the x-axis 44, as defined by Equation 3 above, the power produced by every PV cell 40 in the row 42 is also identical. Therefore, the optimal electrical configuration is to connect the PV cells 40 in series in each vertical row 42. When connected in series, all cells 40 in the vertical row 42 operate at equal current. With all cells in the row receiving equal irradiance and producing equal heat from electrical $I^2R$ losses, all cells operate at the same temperature and therefore at the same selected point on the efficiency curve of FIG. 2A. The series wiring arrangement of the PV cells 40 is discussed below.

Figure 7:
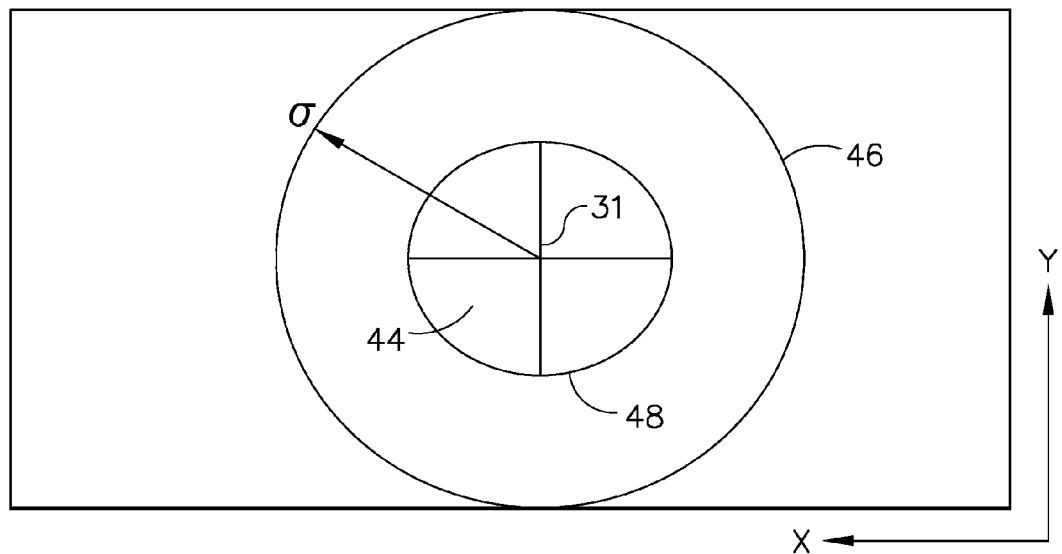
FIG. 7 illustrates the perpendicular projection of the circular Gaussian beam on the PV array of FIG. 6.
Figure 8:
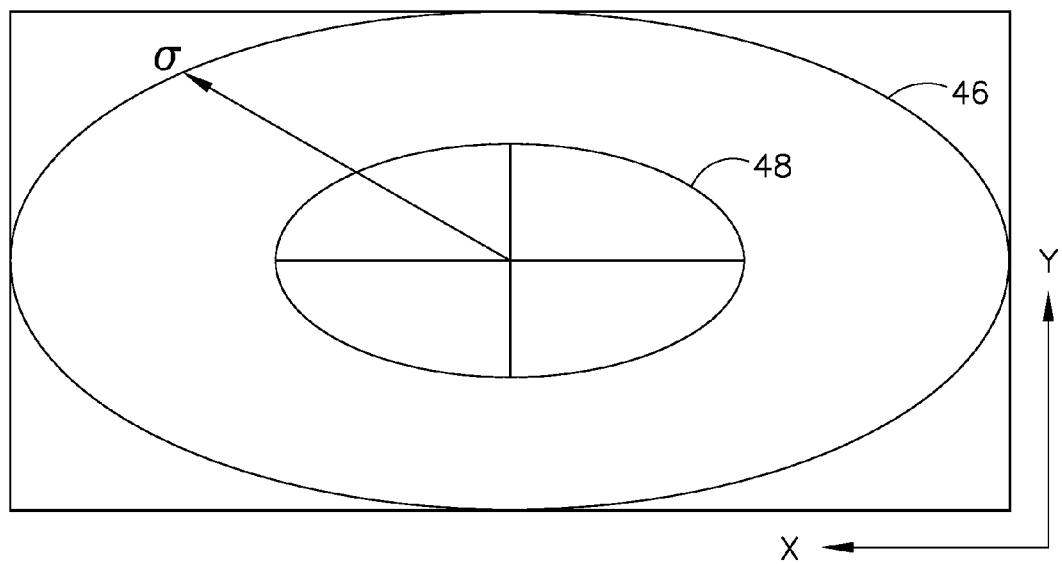
FIG. 8 illustrates the non-perpendicular projection of the circular Gaussian beam on the PV array of FIG. 6.

Referring next to FIGS. 7 and 8, the projection of a circular Gaussian laser beam on a rectangular PV array 32 results in circular or ellipsoidal patterns depending on the angle of incidence of the Gaussian laser beam. The width of a beam projection is least when the laser beam is positioned perpendicular to the array because the beam makes a circular pattern on the array as shown in FIG. 7. The longitudinal width of the projection of the beam increases in a Gaussian ellipsoidal pattern as shown in FIG. 8 as the secant of angle α increases. The irradiance for each point on the PV array varies as defined by Equation 5. For any point 44 (FIG. 7) near the vertical axis of the beam projection (i.e., within the range $-\sigma/(\sqrt{2}) < x < \sigma/(\sqrt{2})$), increasing the angle α decreases the irradiance of PV cells 40. For any point 44 farther from the center, increasing the angle α increases the irradiance of the PV cells 40 therein, because the point 44 becomes closer to the centerline of the beam.

Figure 9:
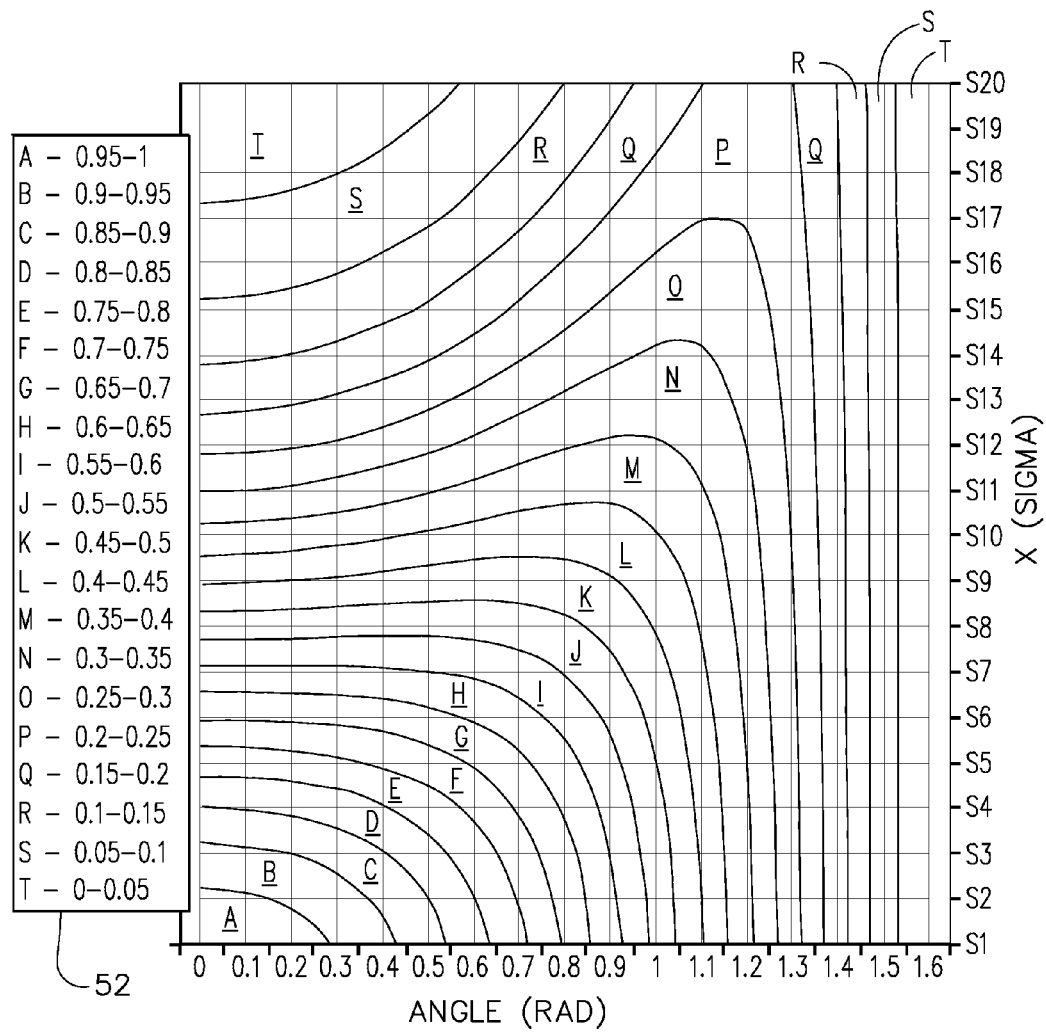
FIG. 9 illustrates the beam intensity bands as a function of incident angle of the beam on the PV array.

The overall effect of the beam angle of incidence σ on irradiance as a function of the distance from the centerline is shown graphically in FIG. 9. The plot lines are for any constant value of y, i.e., the plotted ratio of irradiance at α=1 and x=1 to the irradiance at α=0 and x=0 is the same, regardless of whether y=0 or y=2.0. Generally, when the beam arrives at the PV array 32 at an oblique angle, the beam is distributed in an elliptical shape, rather than in a circular formation.

The PV array 32 includes electrical connections (not shown) for each cell 40 or string of cells 42, and a cooling system for each PV cell 40 or for each string of PV cells 42. The electrical connections and cooling system for each PV cell 40 or string of PV cells 42 are sized for the maximum irradiance received by the PV cell 40 or string of PV cells 42. The size of the electrical connections and cooling system is based on the maximum irradiance given by Equation 5 for any incident angle of laser beam that is likely to be encountered during operation of the beam-powered aircraft 32. The cooling system may be simple, such as a thermal radiation from the surface of the PV cell, or may be complex, such as a manifold carrying a pump-fed liquid coolant.

Referring again to FIG. 9, an irradiance chart for a planar array is generally designated as 50, and includes a gradient scale 52. The scale 52 indicates irradiance levels for a constant y, relative to irradiance at x=0, α=0. Irradiance of the PV cells 40 varies as a function of beam azimuth angle and x, x being defined as the horizontal distance from the center of the laser beam projected on the PV array 32. The scale at the right side of FIG. 9 indicates x in units of σ/10, i.e. x of 20=2σ.

Previously, power-beaming techniques have not considered the relationship between reflection at the cell surface and the angle of incidence of the beam on each cell in the PV array. However, the performance of the PV array 32 is improved by taking into account the relationship between reflection at the surface of the PV cell 40 and the angle of incidence of the laser beam. When a laser beam strikes a PV cell 40 at a non-normal angle, more of the laser beam reflects away from the PV cell 40. This reflection reduces power transfer to the PV cell 42. For smaller angles of incidence the reduction in power transfer due to reflection is small, but as the incident angle increases, the reduction in power transfer also increases.

Performance loss at each angle may be computed for each cell if the polarization of the laser and the refractive index of the first-surface material of the PV cells 40 is known. Modifying Equation 2 and Equation 3 to allow for reflective losses, the angle θ of each PV cell 40 may be modified so that all PV cells 40 having a constant x coordinate receive a uniform absorbed irradiance rather than uniform incident irradiance. If the polarization is unknown or variable, the parameters representing the worst-case polarization may be assumed.

Figure 10:
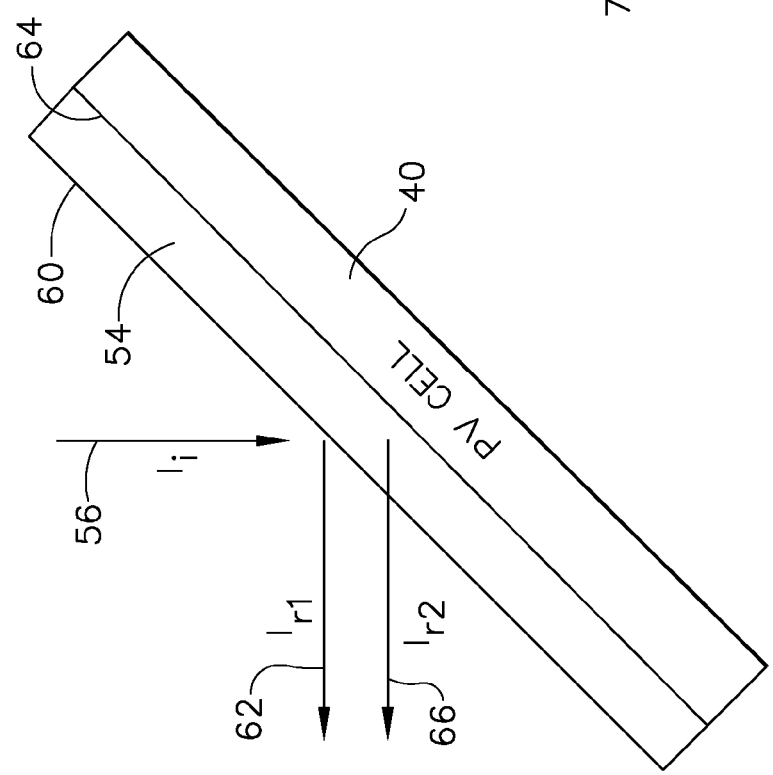
FIG. 10 illustrates a PV cell having a flat coverglass.

Referring next to FIG. 10, a typical single PV cell 40 has a flat coverglass 54. An incident beam designated as 56, having intensity $I_i$, impinges on the cover glass 58 on the PV cell 40. A portion of the beam 56 reflects at a first surface 60 of the cover glass 58. The first surface 60 reflects a portion 62 of the laser beam, having intensity $I_{r1}$. The surface 64 of the PV cell 40, defined by the interface of the coverglass 54 and the PV cell 40, reflects a second portion 66 of laser beam 56. Beam portion 66 has intensity $I_{r2}$. The reflected beam portions 62 and 66 can cause significant lost power in the PV cell 40.

Figure 11:
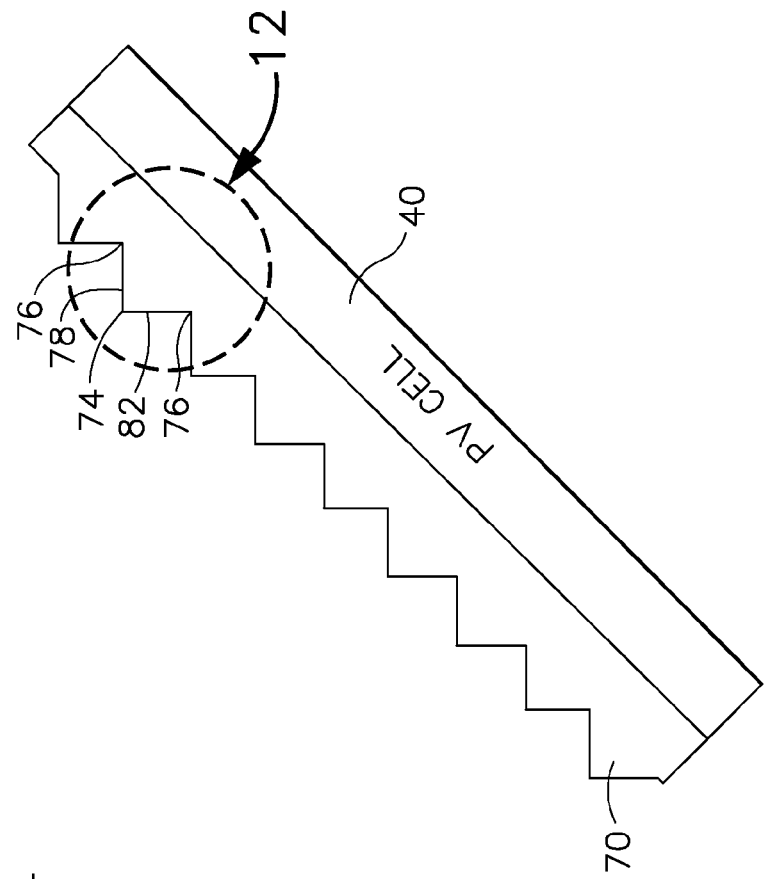
FIG. 11 illustrates a PV cell having a grooved coverglass.
Figure 12:
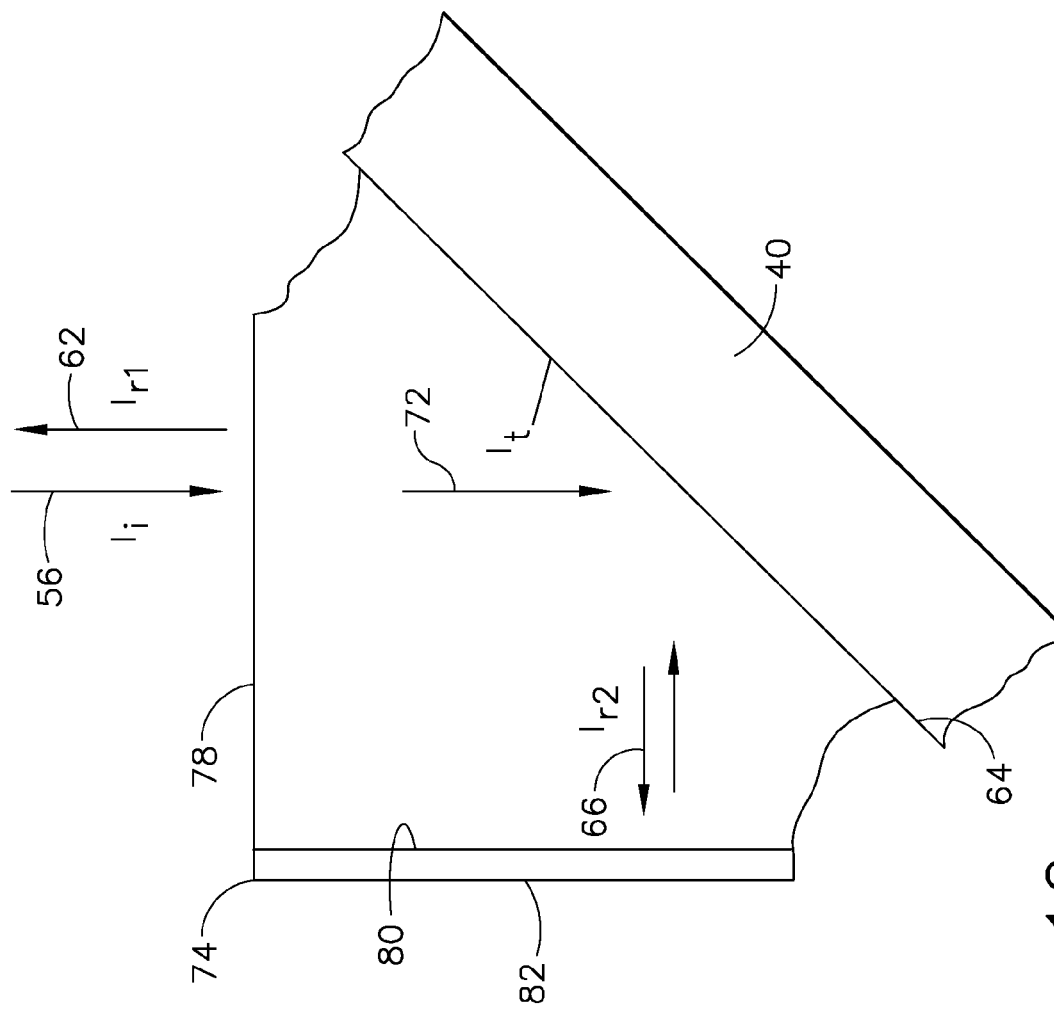
FIG. 12 is an enlargement of area 12 shown in FIG. 11.

Referring next to FIGS. 11 and 12, a preferred embodiment of the present invention has a grooved or saw tooth configured cover glass 70. The grooved coverglass 70 minimizes reflective losses by reducing the laser beam (not shown) angle of incidence. The coverglass 70 covers the PV cell 40. The coverglass 70 includes ridges 74 and grooves 76 with horizontal faces 78 and vertical faces 82. First, the incident beam (not shown) impinges on coverglass 70 approximately perpendicular to the horizontal face 78. This minimizes reflection at horizontal face 78, which reduces the reflected intensity $I_{r1}$ of first beam 62 relative to a reflection from a smooth coverglass 60 arranged as in FIG. 10. The intensity, $I_t$, of the transmitted beam portion 72 is thus increased when it impinges on the PV cell 40. The PV cell 40 absorbs most of the transmitted beam portion 72, but a portion of the transmitted beam portion 72 is reflected by the PV cell surface 64. The light beam portion 66 reflected from the surface 64 of the PV cell has intensity $T_{r2}$. Light beam portion 66 is reflected in the direction to the left and impinges on a reflective coating 80 on the vertical face 82 of the groove 76. The light beam portion 66 reflects back again onto the PV cell 40 where most of the intensity $I_{r2}$ is absorbed by PV cell 40.

Continuing to refer to FIGS. 11 and 12, grooved surface 70 provides an efficiency advantage for light arriving at oblique angles to the PV cell surface 64, because of the reduced intensity $I_{r1}$ of the reflected beam (not shown) at the first surface 74. A reflective coating 80 is applied to vertical faces 82 of grooves 76 to help reduce losses that occur at the interface between the coverglass and the PV cell. The reflective coating 80 returns light to the PV cell surface 64 that would otherwise be lost, and thereby nearly eliminates the beam intensity losses due to reflection from the interface surface 64. The grooved coverglass 70 of the present invention achieves essentially 100% coverage of the PV cell surface 64 with the use of grooves 76, and arranges the grooves 76 to reduce the reflected beam at the first surface 78. The reflective coating 80 is used only on one face 82 of the groove, while the other face 78 is transparent for admitting the light beam 56.

Any method for applying a reflective surface may be used to deposit the reflective surface on only the vertical faces 82 of the grooves 76. By way of example and not limitation, there are known methods used for depositing fine aluminum traces on circuit boards or integrated circuits, which may be applied to deposit reflective aluminum patterns on glass.

Fluctuations in irradiance from one PV cell 40 to another and from one time to another are caused by beam jitter and atmospheric turbulence. Jitter in the beam-pointing device causes the Bessel-shaped beam to move rapidly across a PV array 12, 16, 18, or 32, in a Gaussian pattern. Turbulence in the atmosphere causes localized spots on the PV array 16, 18, or 32, to dim or brighten with a log-normal distribution. Both beam jitter and atmospheric turbulence cause the irradiance of the PV cells 40 to fluctuate, for typically a few milliseconds.

Figure 13:
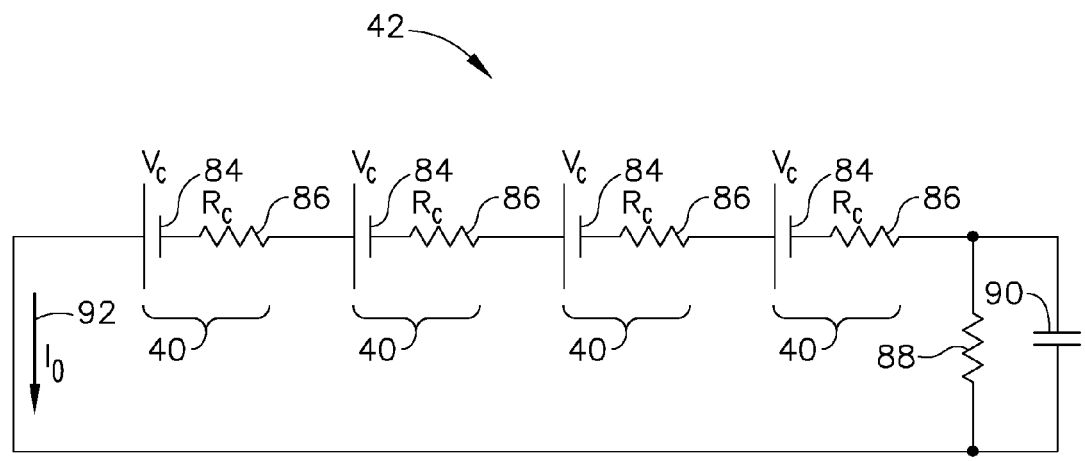
FIG. 13 illustrates an equivalent circuit of a string of series-connected PV cells.
Figure 14:
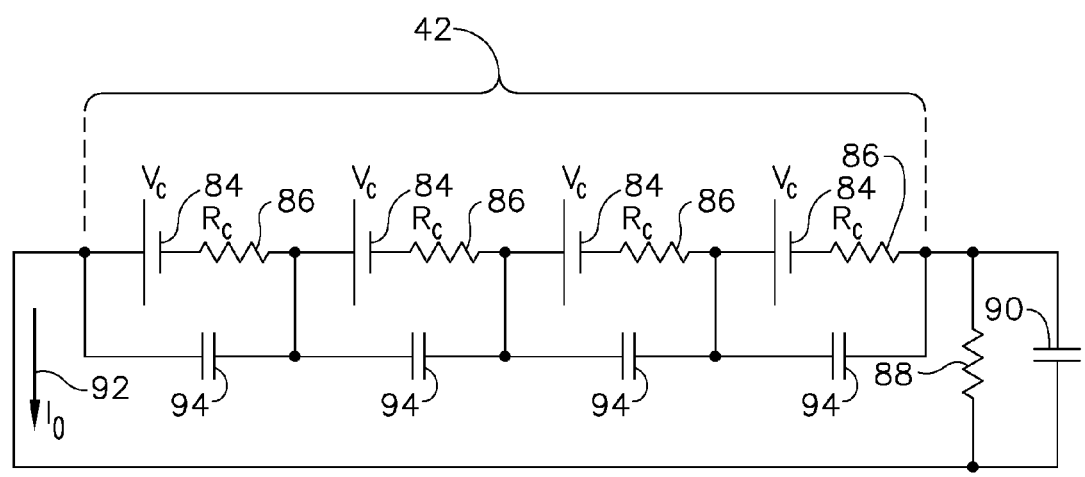
FIG. 14 illustrates the string circuit of FIG. 13 having parallel-connected capacitors.

In order to compensate for fluctuations in irradiance, capacitance may be introduced in parallel across each PV cell 40. FIG. 13 shows an equivalent circuit of a string 42 of series-interconnected PV cells 40, in which fluctuation in irradiance between PV cells 40 reduces the overall efficiency of the PV array 12, 16, 18 or 32. The cause of the fluctuation is demonstrated by a string 42 comprised of N PV cells 40. Each PV cell 40 has an equivalent circuit having a voltage source 84 connected in series with the internal resistance 86 of the PV cell 42. The string of cells 42 feeds a load resistance 88 and a very large capacitor 90. Capacitor 90 smoothes out the ripples in the voltage waveform applied to a load resistor 88.

When the string of cells 42 is operating under steady, uniform illumination, the current through all the cells 40 is $I_0$, indicated by arrow 92. The total power lost to resistive heating in the PV array 12, 16, 18 or 32 is thus calculated by Equation 7:

$$I_0 = NI_0^2 R_c \qquad \text{Equation 7}$$

When a local fluctuation increases irradiance to one PV cell 40, the current from that PV cell 40 increases by the change in current, $\Delta I$ for a duration of time, $\Delta t$. With PV cells 40 connected as a series connection of voltage sources and their internal resistances, the increased current flows through all of the PV cells 40 that are connected in series. The total power dissipated due to the internal cell resistance increases as shown in Equation 8:

$$P = N(I_0 + \Delta I)^2 R_e \qquad \text{Equation 8}$$

In a preferred embodiment, the photovoltaic array 12, 16, 18 or 32, of the present invention is arranged in one or more strings 42, with a capacitor 94 wired in parallel with each PV cell 40 in the string of cells 42. Each capacitor 94 has capacitance $C_c$. Each PV cell 40 has approximately the same internal resistance value $R_c$, and characteristic voltage $V_c$. When a local fluctuation increases the current through an individual PV cell 40 in the string of cells 42, most of that current increase does not flow through all of the remaining PV cells 40. Instead, the change in current $\Delta I$ charges the parallel capacitor 94 to a voltage that is above the steady state voltage of the capacitor. The initial extra voltage $\Delta V$ is shown by Equation 9:

$$\Delta V = \Delta I \Delta t / C_c \qquad \text{Equation 9}$$

The extra charge $\Delta I \Delta t$ on the capacitor 94 is then dissipated slowly through the remaining PV cells 40. The extra current decays in proportion with a time constant that is dependent on the internal resistance $R_c$. The total current $I(t)$ as a function of time is defined in Equation 10:

$$I(t) = \Delta V / [(N-1)R_c] \exp(-t/[C_c(N-1)R_c]) + I_0 \qquad \text{Equation 10}$$

The total resistive energy loss is decreased because the average current through the other PV cells 40 is lower than $I_0 + \Delta I$.

By increasing the value of $C_c$, the resistive losses in the string of cells 42 due to fluctuating local irradiance can be decreased. For larger values of $C_c$, the energy loss with capacitors is 1/N as great as without capacitors. The particular value of $C_c$ that is selected may vary depending on the magnitude and frequency of fluctuation that is likely to be encountered in a specific application, available capacitor technology, and the relative cost of adding weight to the PV array 12, 16, 18 or 32, versus the reduction in efficiency of the PV array. Equation 10 illustrates mathematically that there are no conditions where adding a capacitor 94 in parallel with the PV cell 40 leads to increased energy loss.

While the invention has been described with reference to preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A photovoltaic (PV) array comprising:
    a plurality of photovoltaic (PV) cells, each PV cell of the plurality of PV cells being configured to receive at least one optical power beam and convert power from the at least one optical power beam to electrical power; and
    wherein the PV array has a surface geometry arrangement in which at least some of the plurality of PV cells are disposed at an angle with respect to the at least one optical power beam to substantially equalize irradiance of the plurality of PV cells received from the at least one optical power beam across the PV array;
    wherein the surface geometry arrangement is a sawtooth configuration having a plurality of cusps and a plurality of slopes; and
    wherein the plurality of slopes increase progressively in angle from an edge of the PV array to a center of the PV array; and
    wherein the surface geometry arrangement compensates for a beam intensity curve approximately equal to a beam intensity curve of a conical array.

2. The PV array of claim 1, wherein the surface geometry arrangement is a curved conical arrangement.

3. The PV array of claim 1, wherein the PV array is configured symmetrically about an axis of the PV array and forms a circular periphery.

4. The PV array of claim 1, wherein the PV array has a rectangular side profile.

5. The PV array of claim 1, wherein the PV array having a first axis and a second axis, the PV array being rotatable about the first axis and fixed with respect to the second axis, such that the angle of incidence on the PV array of the at least one optical power beam when the PV array is rotatably adjusted with respect to the at least one optical power beam provides a substantially uniform irradiance along a vertical portion of the PV array.

6. The PV array of claim 5, wherein the PV array is configured in an elliptical shape.

7. The PV array of claim 1, wherein the PV array comprises at least one string of electrically interconnected PV cells attached to a side of the PV array.

8. The PV array of claim 7 wherein the plurality of PV cells in the at least one string being electrically connected in series.

9. The PV array of claim 7 wherein each PV cell of the plurality of PV cells further includes a capacitor electrically connected in parallel therewith.

10. The PV array of claim 4 comprising a plurality of strings of PV cells, the plurality of strings in the PV array being electrically connected in parallel.

11. The PV array of claim 1 wherein the PV array further comprising a transparent, smooth window disposed over at least one surface of the PV array for reducing air turbulence when applied to an aircraft in flight.

12. The PV array of claim 1, wherein at least one PV cell of the plurality of PV cells having a coverglass covering the PV cell, and wherein the coverglass configured in a sawtooth profile having a plurality of ridges and a plurality of grooves.

13. The PV array of claim 12 wherein each groove of the plurality of grooves has a transparent first surface substantially perpendicular to the optical power beam.

14. The PV array of claim 13 wherein each groove of the plurality of grooves has a second surface, the second surface having a reflective coating and being substantially parallel to the optical power beam, wherein at least a portion of a beam impinging on the PV cell through the first surface is reflected at the reflective coating and directed back towards the PV cell to reduce reflective losses in the PV cell.

15. The PV array of claim 12 wherein the PV array is configured substantially circular or elliptical.

16. The PV array of claim 12 wherein the PV array having a first axis and a second axis, the PV array being rotatable about the first axis and fixed with respect to the second axis, such that the angle of incidence on the PV array of the at least one optical power beam when the PV array is rotatably adjusted with respect to the at least one optical power beam provides a substantially uniform irradiance along a vertical portion of the PV array.

17. A method of converting laser beam power to electrical energy with a photovoltaic (PV) array, the PV array comprised of a plurality of PV cells, the method comprising:
providing the PV array on an airborne vehicle, the PV array having a sawtooth configuration having a plurality of cusps and a plurality of slopes wherein the plurality of slopes increase progressively in angle from an edge of the PV array to a center of the PV array, in which at least some of the plurality of PV cells are disposed at an angle with respect to the at least one optical power beam arranged to substantially equalize irradiance of the plurality of PV cells received from a laser beam across the PV array and wherein the surface geometry arrangement compensates for a beam intensity curve approximately equal to a beam intensity curve of a conical array;

directing the at least one optical power beam toward the PV array;

receiving the at least one optical power beam on the PV array;

converting the at least one optical power beam into electrical power; and powering the airborne vehicle with the converted electrical power;

wherein the at least one optical power beam has a time-averaged intensity profile I(r) represented by the following equation:

$I(r)=I_0 \exp(-r^2/\sigma^2)$ where:
$I_0$=intensity at the beam's center
r=distance from the beam's center
$\sigma$=1/e fall-off distance.

18. The method of claim 17, wherein the PV array is formed by at least one string of PV cells electrically interconnected in series attached to a side of the PV array.

19. The method of claim 17, wherein each PV cell of the plurality of PV cells further includes a capacitor electrically connected in parallel therewith.

20. The method of claim 17, wherein the step of receiving the beam on the PV array further comprises rotating the PV array along a first axis with respect to a second axis, such that the at least one optical power beam when the PV array is rotatably adjusted with respect to the at least one optical power beam provides a substantially uniform irradiance along a vertical portion of the PV array.

21. The system of claim 1 wherein each slope in the plurality of slopes has an angle θ, measured from a plane of the array and a time-averaged intensity profile I(r), the angle θ defined by the following equation:

$\theta = \arccos(I(r_{max})/I(r))$ where: $I(r_{max})$=intensity at the array's edge
r=distance from the beam's center
I(r)=intensity at distance r from the beam's center.

22. The system of claim 1 wherein the optical power beam has a time-averaged intensity profile I(r) represented by the following equation:

$I(r)=I_0 \exp(-r^2/\sigma^2)$ where:
$I_0$=intensity at the beam's center
r=distance from the beam's center
$\sigma$=1/e fall-off distance.

* * * * *